US011362665B2

(12) United States Patent
Reilly

(10) Patent No.: US 11,362,665 B2
(45) Date of Patent: Jun. 14, 2022

(54) LOW POWER CRYO-CMOS CIRCUITS WITH NON-VOLATILE THRESHOLD VOLTAGE OFFSET COMPENSATION

(71) Applicant: Microsoft Technology Licensing, LLC, Redmond, WA (US)

(72) Inventor: David J. Reilly, Sydney (AU)

(73) Assignee: Microsoft Technology Licensing, LLC, Redmond, WA (US)

( * ) Notice: Subject to any disclaimer, the term of this patent is extended or adjusted under 35 U.S.C. 154(b) by 102 days.

(21) Appl. No.: 17/013,941

(22) Filed: Sep. 8, 2020

(65) Prior Publication Data
US 2022/0077859 A1    Mar. 10, 2022

(51) Int. Cl.
| H03K 19/195 | (2006.01) |
| H01L 27/18 | (2006.01) |
| H01L 27/11524 | (2017.01) |
| G11C 11/56 | (2006.01) |
| G06N 10/00 | (2022.01) |

(52) U.S. Cl.
CPC ......... *H03K 19/1958* (2013.01); *G06N 10/00* (2019.01); *G11C 11/5621* (2013.01); *H01L 27/11524* (2013.01); *H01L 27/18* (2013.01)

(58) Field of Classification Search
CPC ............... H03K 19/1958; G06N 10/00; G11C 11/5621; H01L 27/11524; H01L 27/18
USPC ...................................................... 327/527
See application file for complete search history.

(56) References Cited

U.S. PATENT DOCUMENTS

| 5,424,656 A | 6/1995 | Gibson et al. |
| 7,352,631 B2* | 4/2008 | Burnett ............. H01L 27/11521 |
| | | 257/E21.345 |
| 2008/0023763 A1* | 1/2008 | Blanchard ............... H01L 22/20 |
| | | 257/E21.417 |

FOREIGN PATENT DOCUMENTS

WO    2008085974 A2    7/2008

OTHER PUBLICATIONS

Mizuno, et al., "Experimental Study of Threshold Voltage Fluctuation Due to Statistical Variation of Channel Dopant Number in MOSFET's", In Journal of IEEE Transactions on Electron Devices, vol. 41, Issue 11, Nov. 1994, pp. 2216-2221.
(Continued)

*Primary Examiner* — Tomi Skibinski
(74) *Attorney, Agent, or Firm* — Ranjeev Singh; Singh Law, PLLC

(57) ABSTRACT

Systems and methods related to low power cryo-CMOS circuits with non-volatile threshold voltage offset compensation are provided. A system includes a plurality of devices configured to operate in a cryogenic environment, where a first distribution of a threshold voltage associated with the plurality of devices has a first value indicative of a measure of spread of the threshold voltage. The system further includes control logic, coupled to each of the plurality of devices, configured to modify a threshold voltage associated with each of the plurality of devices such that the first distribution is changed to a second distribution having a second value of the measure of spread of the threshold voltage representing a lower variation among threshold voltages of the plurality of devices.

20 Claims, 8 Drawing Sheets

(56) References Cited

OTHER PUBLICATIONS

Pauka, et al., "A Cryogenic Interface for Controlling Many Qubits", In Repository of arXiv:1912.01299, Dec. 3, 2019, 7 Pages.

Reilly, D.J, "Challenges in Scaling-up the Control Interface of a Quantum Computer", In Proceedings of IEEE International Electron Devices Meeting, Dec. 7, 2019, 6 Pages.

"International Search Report and Written Opinion Issued in PCT Application No. PCT/US21/035076", dated Sep. 24, 2021, 16 pages.

* cited by examiner

LOW POWER CRYO-CMOS CIRCUITS WITH NON-VOLATILE THRESHOLD VOLTAGE OFFSET COMPENSATION

BACKGROUND

Semiconductor based integrated circuits used in electronic devices, such as digital processors, include digital circuits based on complementary metal-oxide semiconductor (CMOS) technology. An additional approach to the use of processors and related components, based on CMOS technology, is the use of superconducting logic based devices. Superconducting logic based devices can also be used to process quantum information, such as qubits.

SUMMARY

In one aspect, the present disclosure relates to a system including a plurality of devices configured to operate in a cryogenic environment, where a first distribution of a threshold voltage associated with the plurality of devices having a first value indicative of a measure of spread of the threshold voltage. The system may further include control logic, coupled to each of the plurality of devices, configured to modify a threshold voltage associated with each of the plurality of devices such that the first distribution is changed to a second distribution having a second value of the measure of spread of the threshold voltage representing a lower variation among threshold voltages of the plurality of devices.

In another aspect, the present disclosure relates to a method in a system comprising a plurality of devices having an associated threshold voltage. The system may include determining a variation among threshold voltages of the plurality of devices while operating the integrated circuit in a cryogenic environment, where each of the plurality of devices comprises a floating gate. The method may further include modifying threshold voltages associated with at least a subset of the plurality of devices by: (1) injecting charge into a respective floating gate or (2) removing charge from a respective floating gate such that a variation among threshold voltages of the plurality of devices is lowered.

In yet another aspect, the present disclosure relates to a system including a first integrated circuit comprising a quantum device including a plurality of qubit gates, where the quantum device is configured to operate at a cryogenic temperature. The system may further include a second integrated circuit configured to operate at the cryogenic temperature, where the first integrated circuit is coupled to the second integrated circuit. The second integrated circuit may include a plurality of devices, where a first distribution of a threshold voltage associated with the plurality of devices having a first value indicative of a measure of spread of the threshold voltage. The second integrated circuit may further include control logic, coupled to each of the plurality of devices, configured to modify a threshold voltage associated with each of the plurality of devices such that the first distribution is changed to a second distribution having a second value of the measure of spread of the threshold voltage representing a lower variation among threshold voltages of the plurality of devices.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
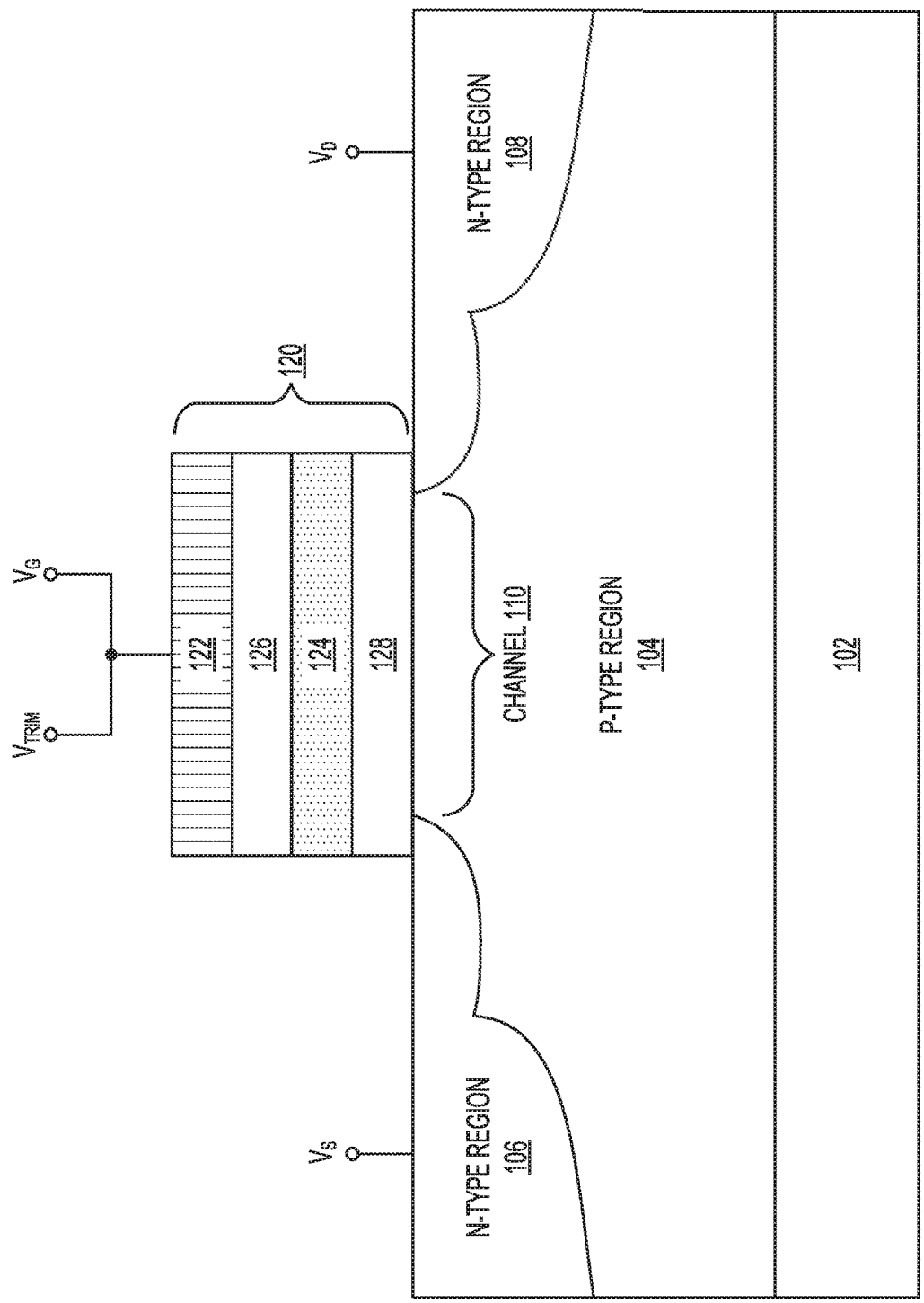
FIG. 1 shows a device with threshold voltage offset compensation in accordance with one example.

Modern computing technology is limited largely by the power dissipated and heat generated by computation using complementary metal oxide semiconductor (CMOS) field effect transistors. The power (P) consumed by the transistors comprises static (leakage) and dynamic components associated with the charging and discharging of the device and interconnect capacitance, C, ($P=CV^2 f$), where V is the voltage and f is the clock frequency. Many processors and memory subsystems limit the clock rate in order to keep power dissipation to a manageable level.

For data center applications, one possible approach to addressing the power dissipation is to cool the transistors and thereby first reducing their static leakage (by freezing-out mobile carriers and thermally activated transport in the sub-threshold region) and further by taking advantage of the increase in carrier mobility that arises from the suppression of electron-photon scattering as temperature is lowered. Increased mobility leads to a steeper transition between ON and OFF states of a transistor, narrowing the supply voltage required to cover the device operating range. Cryogenic operation provides further dynamic power saving by reducing the supply need to suppress sub-threshold swing, that is, the thermally activated transport that remains even when the transistor is biased below threshold.

Cryo-computing, however, brings at least two challenges. First, as the temperature is reduced the threshold voltage $V_{TH}$ increases, requiring a larger supply voltage, $V_{DD}$, to compensate. This increase in the threshold voltage $V_{TH}$ can be compensated to some extent by adjusting dopant concentration and dielectric thickness during fabrication at the foundry. Such transistors, however, then do not function as well at the ambient non-cryogenic temperature. Second, and far more limiting, the variation in the threshold voltage $V_{TH}$ from transistor to transistor means that the supply voltage can only be lowered to the extent that is permitted by the variance in the threshold voltage $V_{TH}$. That is, enough voltage swing is required to ensure all transistors can be switched from fully OFF to the fully ON state. Although cryogenic cooling increases carrier mobility by reducing photon scattering, atomic-scale disorder also leads to scattering and the creation of offset charges that produce a significant variance in the threshold voltage $V_{TH}$ across a die. Furthermore, the threshold voltage fluctuations become larger as the temperature is lowered and device feature size made smaller. These limitations mean that in many situations cryogenically cooling CMOS devices is generally not a viable approach to a net power saving when considering the power cost to produce the cooling. If the offset charge problem could be addressed however, such that the threshold voltage $V_{TH}$ distribution could be made narrower, the increase in mobility and the increase in transconductance at low temperature may lead to significant power savings.

Certain examples of the present disclosure seek to address the variations in the transistor's threshold voltage by actively compensating for offset charge at cryogenic temperatures. Various mechanisms, including Fowler-Nordheim tunneling (FNT) and Hot Carrier Injection (HCl), may be used for this purpose. An example FNT process may include tunneling charge through a thin dielectric via the application of a large voltage bias (e.g., several volts). Charge can also be added to the gate capacitance by creating carriers with energy above the bandgap of the dielectric, effectively enabling over-barrier transport. These hot carrier states can be created with large electric fields in the FET channel, injecting carriers onto the gate capacitance with energies far above the Fermi-level (in the deep overdrive limit). Both through-barrier (FNT) and over-barrier (HCl) processes may be used to modify the charge on a floating gate capacitor in a non-volatile way. Thus, in such examples after the charge is deposited or removed, the charge state remains even in the absence of external power.

FIG. 1 shows a device 100 with threshold voltage offset compensation in accordance with one example. Device 100 may be formed over a substrate 102. Device 100 may further include a p-type region 104, an n-type region 106, and another n-type region 108. In this example, device 100 is formed to function as an NPN transistor. Device 100 may, however, be any other type of transistor (e.g., a PNP transistor), thyristor, thermistor, or any other semiconductor switch or device that is operated in a similar manner as a transistor. Moreover, device 100 may be a metal-oxide semiconductor field effect transistor (MOSFET), a fin field effect transistor (FinFET), an insulated gate field effect transistor (IGFET), or any other type of transistor. In addition, device 100 may be formed using semiconductor processing steps including formation of the various layers as part of a wafer that is later separated into dies that are packaged in the form of integrated circuit packages. Semiconductor processing steps may include the use of techniques such as plasma vapor deposition (PVD), chemical vapor deposition (CVD), dry or wet etching, and other such techniques. Features, including source, drain, and gate, may be formed using such techniques or other suitable semiconductor manufacturing techniques.

With continued reference to FIG. 1, a stack 120 may be formed. Stack 120 may include a control gate 122 and a floating gate 124. Stack 120 may further include a control dielectric layer 126, which may be formed between control gate 122 and floating gate 124. Stack 120 may further include a tunnel dielectric layer 128, which may be formed between floating gate 124 and a top surface of channel 110. Control gate 122 may be formed using polysilicon, metal, metal alloys, or other suitable materials. Floating gate 124 may act as a layer configured to store a controllable amount of charge. Materials such as silicon nitride, polysilicon, silicon, or germanium may be used. In certain examples, nanocrystals may be used to store charge. Control dielectric layer 126 may be formed using any suitable dielectric material. In one example, control dielectric layer 126 may be formed as an oxide/nitride/oxide (ONO) stack. Tunnel dielectric layer 128 may also be formed using any suitable dielectric material such as silicon dioxide or silicon nitride. High-K dielectric stacks may also be used. Although the dimensions of the various layers and regions are not drawn to scale, in one example, tunnel dielectric layer 128 may be configured to be thin enough such that stored electrons or holes may pass through tunnel dielectric layer 128 under the application of appropriate voltages to the various terminals of device 100. Although not shown in FIG. 1, sidewalls may be formed adjacent to each side of stack 120. Although FIG. 1 shows a certain number and a certain type of layers formed as part of stack 120, stack 120 may further include additional or fewer layers, as needed.

Still referring to FIG. 1, device 100 may have several terminals, which may be coupled to receive different voltages. As an example, device 100 may include: (1) a terminal for receiving a source voltage (Vs) coupled to the source (e.g., n-type region 106) of device 100, (2) a terminal for receiving a drain voltage (VD) coupled to the drain (e.g., n-type region 108) of device 100, (3) a terminal for receiving a gate voltage (VG) coupled to the control gate (e.g., control gate 122) of device 100, and (4) a terminal for receiving a trim voltage ($V_{TRIM}$) coupled to the control gate (e.g., control gate 122) of device 100. In this example, trim voltage ($V_{TRIM}$) may be supplied via an external circuit and may be used initially to adjust the offset charge. Trim voltage ($V_{TRIM}$) may be used to add or subtract charge to the gate capacitance via FNT and/or HCl. In one example, this extra connection could be placed on a separate routing layer, connecting to the transistors via a via or another routing structure formed within the substrate associated with device 100.

In terms of the operation of device 100, appropriate voltages coupled via the terminals of device 100 may be used to inject charge or remove charge stored in floating gate 124. As an example, during a first phase a high trim voltage ($V_{TRIM}$) (e.g., a few volts) may be applied to control gate 122 and at the same time a high drain voltage (VD) may be applied to the drain region of device 100. As a result, during the first phase, electrons may be injected into floating gate 124. In a second phase, any holes formed in other parts of device 100 may be removed. As an example, a certain voltage (lower than the trim voltage applied during the first phase) may be applied to control gate 122 and at the same time a negative drain voltage (VD) may be applied to the drain region of device 100. As a result, during the second phase, any holes formed in certain regions of device 100 may be removed. The second phase may only be needed when device 100 is formed as a semiconductor-on-insulator (SOI) device. This is because if device 100 is formed as a bulk device, the holes may be removed through the well electrodes.

To reduce the capacitive effect of the routing structures for routing the trim voltage ($V_{TRIM}$), such structures may be decoupled from device 100 after the trimming operation. In addition, any control circuitry used for the trimming operation may also be permanently decoupled from device 100. As an example, e-fuses or other such technologies may be used to burn off the connection for receiving the trim voltage ($V_{TRIM}$) after the trimming operation is complete.

Figure 2:
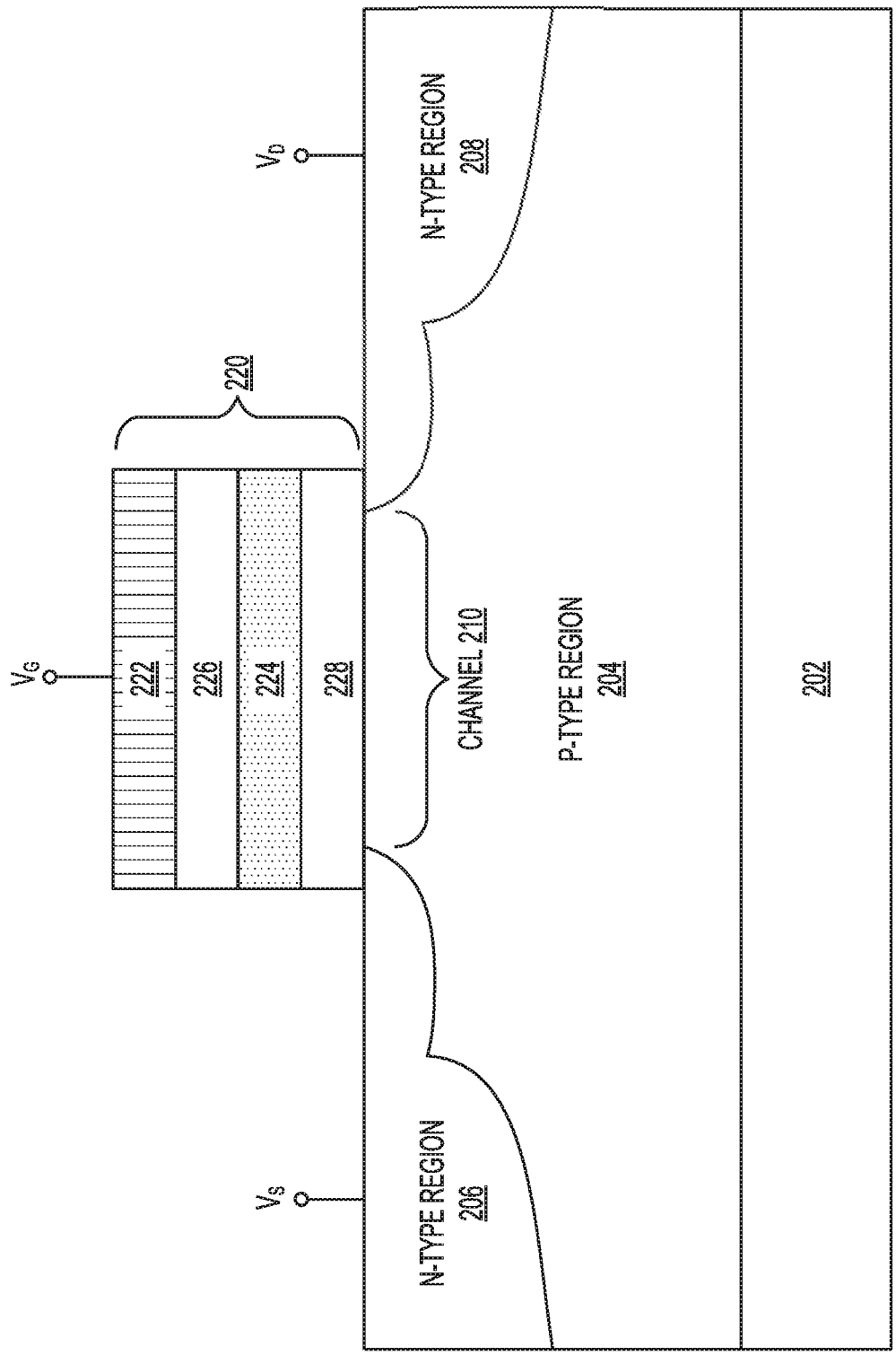
FIG. 2 shows another device with threshold voltage offset compensation in accordance with one example.

FIG. 2 shows a device 200 with threshold voltage offset compensation in accordance with one example. Similar to device 100, device 200 may be formed over a substrate 202. Device 200 may further include a p-type region 204, an n-type region 206, and another n-type region 208. In this example, device 200 is formed to function as an NPN transistor. Device 200 may, however, be any other type of transistor (e.g., PNP transistor), thyristor, thermistor, or any other semiconductor switch or device that is operated in a similar manner as a transistor. Moreover, device 200 may be a metal-oxide semiconductor field effect transistor (MOSFET), a fin field effect transistor (FinFET), an insulated gate field effect transistor (IGFET), or any other type of transistor. In addition, device 200 may be formed using semiconductor processing steps including formation of the various layers as part of a wafer that is later separated into dies that are packaged in the form of integrated circuit packages. Semiconductor processing steps may include the use of techniques such as plasma vapor deposition (PVD), chemical vapor deposition (CVD), dry or wet etching, and other such techniques. Features, including source, drain, and gate may be formed using such techniques or other suitable semiconductor manufacturing techniques.

With continued reference to FIG. 2, a stack 220 may be formed. Stack 220 may include a control gate 222 and a floating gate 224. Stack 220 may further include a control dielectric layer 226, which may be formed between control gate 222 and floating gate 224. Stack 220 may further include a tunnel dielectric layer 228, which may be formed between floating gate 224 and a top surface of channel 210. Control gate 222 may be formed using polysilicon, metal, metal alloys, or other suitable materials. Floating gate 224 may act as a layer configured to store a controllable amount of charge. Materials such as silicon nitride, polysilicon, silicon, or germanium may be used. In certain examples, nanocrystals may be used to store charge. Control dielectric layer 226 may be formed using any suitable dielectric material. In one example, control dielectric layer 226 may be formed as an oxide/nitride/oxide (ONO) stack. Tunnel dielectric layer 228 may also be formed using any suitable dielectric material such as silicon dioxide or silicon nitride. High-K dielectric stacks may also be used. Although the dimensions of the various layers and regions are not drawn to scale, in one example, tunnel dielectric layer 228 may be configured to be thin enough such that stored electrons or holes may pass through tunnel dielectric layer 228 under the application of appropriate voltages to the various terminals of device 200. Although not shown in FIG. 2, sidewalls may be formed adjacent to each side of stack 220. Although FIG. 2 shows a certain number and a certain type of layers formed as part of stack 220, stack 220 may further include additional or fewer layers, as needed.

Still referring to FIG. 2, device 200 may have several terminals, which may be coupled to receive different voltages. As an example, device 200 may include: (1) a terminal for receiving a source voltage (Vs) coupled to the source (e.g., n-type region 206) of device 200, (2) a terminal for receiving a drain voltage (VD) coupled to the drain (e.g., n-type region 208) of device 200, and (3) a terminal for receiving a gate voltage (VG) coupled to the control gate (e.g., control gate 222) of device 200. In this example, control gate 222 is used to first set the charge via tunneling at a high voltage, then the same gate is used for standard transistor gating at a lower voltage.

In terms of the operation of device 200, appropriate voltages coupled via the terminals of device 200 may be used to inject charge or remove charge stored in floating gate 224. As an example, during a first phase a high voltage (e.g., a few volts) may be applied to control gate 222 and at the same time a high drain voltage (VD) may be applied to the drain region of device 200. As a result, during the first phase, electrons may be injected into floating gate 224. In a second phase, any holes formed in other parts of device 200 may be removed. As an example, a certain voltage (lower than the voltage applied to the control gate during the first phase) may be applied to control gate 222 and at the same time a negative drain voltage (Vo) may be applied to the drain region of device 200. As a result, during the second phase, any holes formed in certain regions of device 200 may be removed. The second phase may only be needed when device 200 is formed as a semiconductor-on-insulator (SOI) device. This is because if device 200 is formed as a bulk device, the holes may be removed through the well electrodes.

Figure 3:
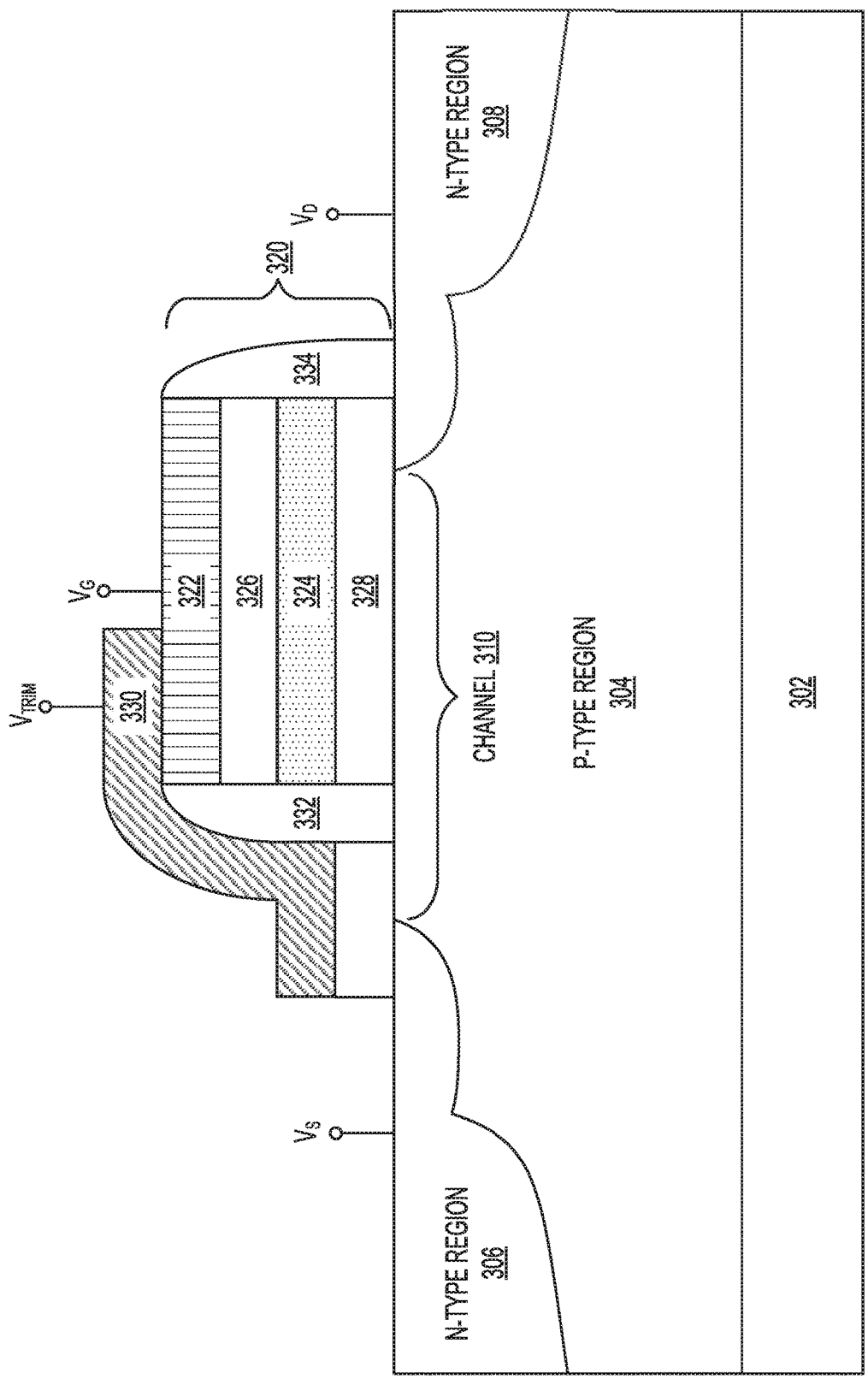
FIG. 3 shows yet another device with threshold voltage offset compensation in accordance with one example.

FIG. 3 shows a device 300 with threshold voltage offset compensation in accordance with one example. Device 300 may be formed over a substrate 302. Device 300 may further include a p-type region 304, an n-type region 306, and another n-type region 308. In this example, device 300 is formed to function as an NPN transistor. Device 300 may, however, be any other type of transistor (e.g., a PNP transistor), thyristor, thermistor, or any other semiconductor switch or device that is operated in a similar manner as a transistor. Moreover, device 300 may be a metal-oxide semiconductor field effect transistor (MOSFET), a fin field effect transistor (FinFET), an insulated gate field effect transistor (IGFET), or any other type of transistor. In addition, device 300 may be formed using semiconductor processing steps including formation of the various layers as part of a wafer that is later separated into dies that are packaged in the form of integrated circuit packages. Semiconductor processing steps may include the use of techniques such as plasma vapor deposition (PVD), chemical vapor deposition (CVD), dry or wet etching, and other such techniques. Features, including source, drain, and gate, may be formed using such techniques or other suitable semiconductor manufacturing techniques.

With continued reference to FIG. 3, a stack 320 may be formed. Stack 320 may include a control gate 322 and a floating gate 324. Stack 320 may further include control dielectric layer 326, which may be formed between control gate 322 and floating gate 324. Stack 320 may further include tunnel dielectric layer 328, which may be formed between floating gate 324 and a top surface of channel 310. Sidewalls 332 and 334 may be formed adjacent to the sidewalls of stack 320. In addition, a second split control gate 330 may be formed. Control gate 322 and split control gate 330 may be formed using polysilicon, metal, metal alloys, or other suitable materials. Floating gate 324 may act as a layer configured to store a controllable amount of charge. Materials such as silicon nitride, polysilicon, silicon, or germanium may be used. In certain examples, nanocrystals may be used to store charge. Control dielectric layer 326 may be formed using any suitable dielectric material. In one example, control dielectric layer 326 may be formed as an oxide/nitride/oxide (ONO) stack. Tunnel dielectric layer 328 may also be formed using any suitable dielectric material such as silicon dioxide or silicon nitride. High-K dielectric stacks may also be used. Although the dimensions of the various layers and regions are not drawn to scale, in one example, tunnel dielectric layer 328 may be configured to be thin enough such that stored electrons or holes may pass through tunnel dielectric layer 328 under the application of appropriate voltages to the various terminals of device 300.

Although FIG. 3 shows certain number and certain type of layers formed as part of stack 320, stack 320 may further include additional or fewer layers, as needed.

Still referring to FIG. 3, device 300 may have several terminals, which may be coupled to receive different voltages. As an example, device 300 may include: (1) a terminal for receiving a source voltage (Vs) coupled to the source (e.g., n-type region 306) of device 300, (2) a terminal for receiving a drain voltage (VD) coupled to the drain (e.g., n-type region 308) of device 300, (3) a terminal for receiving a gate voltage (VG) coupled to a first control gate (e.g., control gate 322) of device 300, and (4) a terminal for receiving a trim voltage ($V_{TRIM}$) coupled to a second control gate (e.g., control gate 330) of device 300. In this example, trim voltage ($V_{TRIM}$) may be supplied via an external circuit and may be used initially to adjust the offset charge. Trim voltage ($V_{TRIM}$) may be used to add or subtract charge to the gate capacitance via FNT and/or HCl. In this example, control gate 330 is used to first set the charge via tunneling at a high voltage, then control gate 322 is used for standard transistor gating at a lower voltage.

In terms of the operation of device 300, appropriate voltages coupled via the terminals of device 300 may be used to inject charge or remove charge stored in floating gate 324. As an example, during a first phase a high trim voltage ($V_{TRIM}$) (e.g., a few volts) may be applied to control gate 330 and at the same time a high drain voltage (VD) may be applied to the drain region of device 300. As a result, during the first phase, electrons may be injected into floating gate 324. In a second phase, any holes formed in other parts of device 300 may be removed. As an example; a certain voltage (lower than the trim voltage applied during the first phase) may be applied to control gate 330 and at the same time a negative drain voltage (VD) may be applied to the drain region of device 300. As a result; during the second phase, any holes formed in certain regions of device 300 may be removed. The second phase may only be needed when device 300 is formed as a semiconductor-on-insulator (SOI) device. This is because if device 300 is formed as a bulk device; the holes may be removed through the well electrodes.

Figure 4:
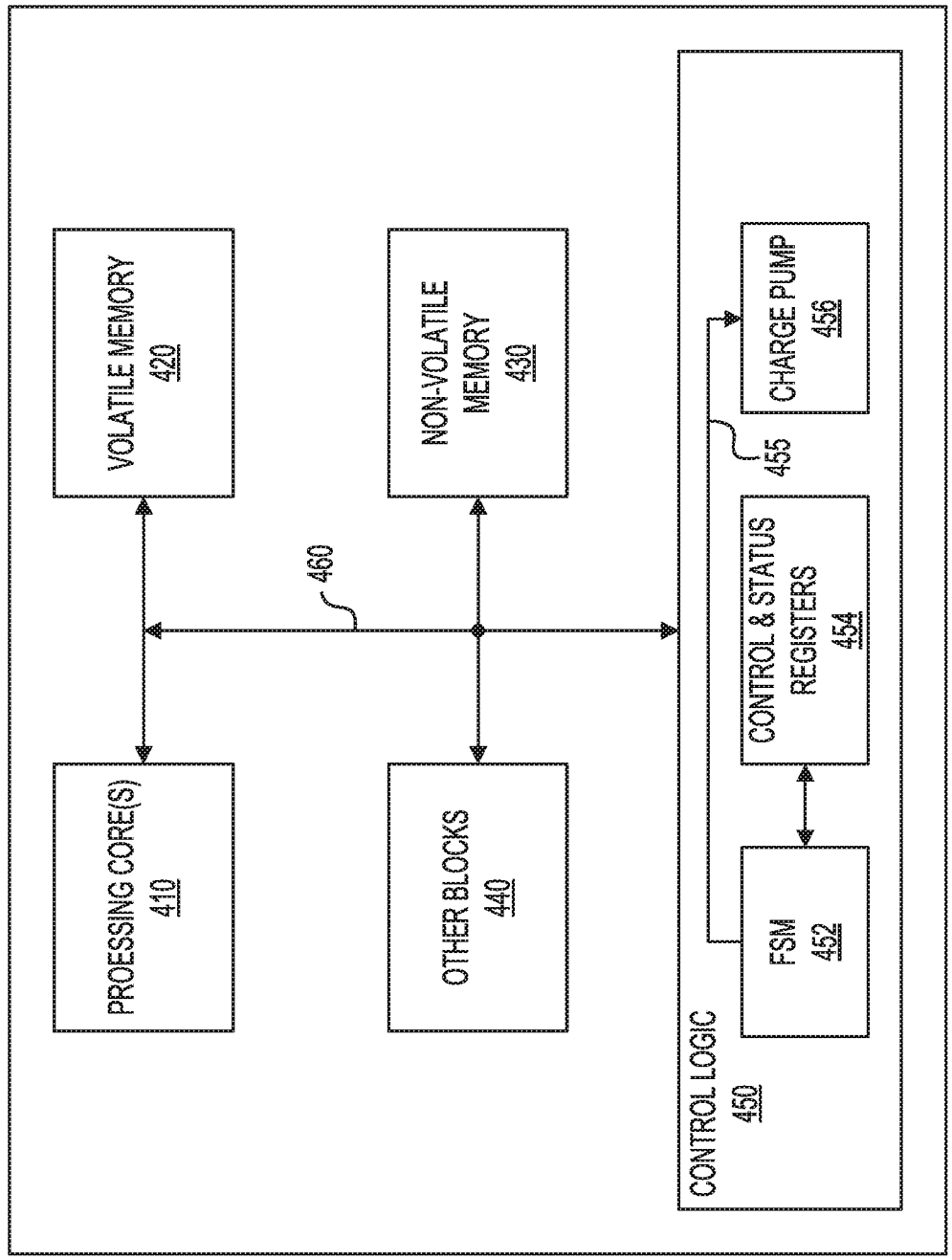
FIG. 4 shows a system including devices with threshold voltage offset compensation in accordance with one example.

FIG. 4 shows a system 400 having control logic 450 associated with threshold voltage offset compensation in accordance with one example. System 400 may include one or more of any type of processor, memory; CPU, GPU, FPGA, or any other type of devices for use in an information processing system. In this example, system 400 may include one or more integrated circuits, where each of the integrated circuits may be packaged as a single integrated circuit. At least a subset of the integrated circuits included in system 400 may have any of the type of devices described with respect to FIG. 1, FIG. 2, and FIG. 3. System 400 may include processing core(s) 410, volatile memory 420, non-volatile memory 430, other blocks 440, and control logic 450.

With continued reference to FIG. 4, control logic 450 may include components provisioned for controlling threshold voltage offset compensation. In this example, control logic 450 may include a finite state machine (FSM) 452, control & status registers 454, and a charge pump 456. FSM 452 may be configured such that it can control charge pump 456 via bus 455. Control & status registers 454 may include registers that could be written to or read by FSM 452. As one example, a control register may include fields specifying information concerning the type of voltage waveform(s) generated by charge pump 456. In this manner, charge pump 456 may be configured to generate voltage waveforms under the control of FSM 452. In addition, charge pump 456 may be configured to generate multiple voltage waveforms at the same time, such that appropriate voltages may be coupled to the various terminals associated with device 100, device 200, or device 300. Although FIG. 4 shows system 400 as including a certain number of components, system 400 may include additional or fewer components. Moreover, instead of FSM 452 instructions programmed in a non-volatile memory, such as a NOR flash memory may be used to control charge pump 456.

Circuits constructed from these devices can operate in standard mode (without offset trimming), as well as in low-power mode where the supply voltage is reduced, after a trimming procedure. This procedure may involve measuring the transistor threshold voltage, then adding or removing charge from the floating gate capacitance to adjust the threshold voltage to some predefined value. Control logic 450 may be used to perform the trimming procedure. In this example, every transistor in the circuit undergoes this calibration, but the process is only required to run after the initial cooldown of the chip to cryogenic temperatures. At cold enough temperature, the calibrated charge on the floating gate can remain indefinitely. The calibration process could be done as fast as possible for convenience, but it could also be compatible with serial, low clock rate execution if power consumption must be minimized.

Still referring to FIG. 4, only a subset of the components of system 400 may include devices with threshold voltage offset compensation. Moreover, volatile memory 420 may have devices with engineered threshold voltages that are different from the devices included in non-volatile memory 430. Thus, different components whether located on the same substrate or different substrates may have distinct threshold voltage offset compensation.

Figure 5:
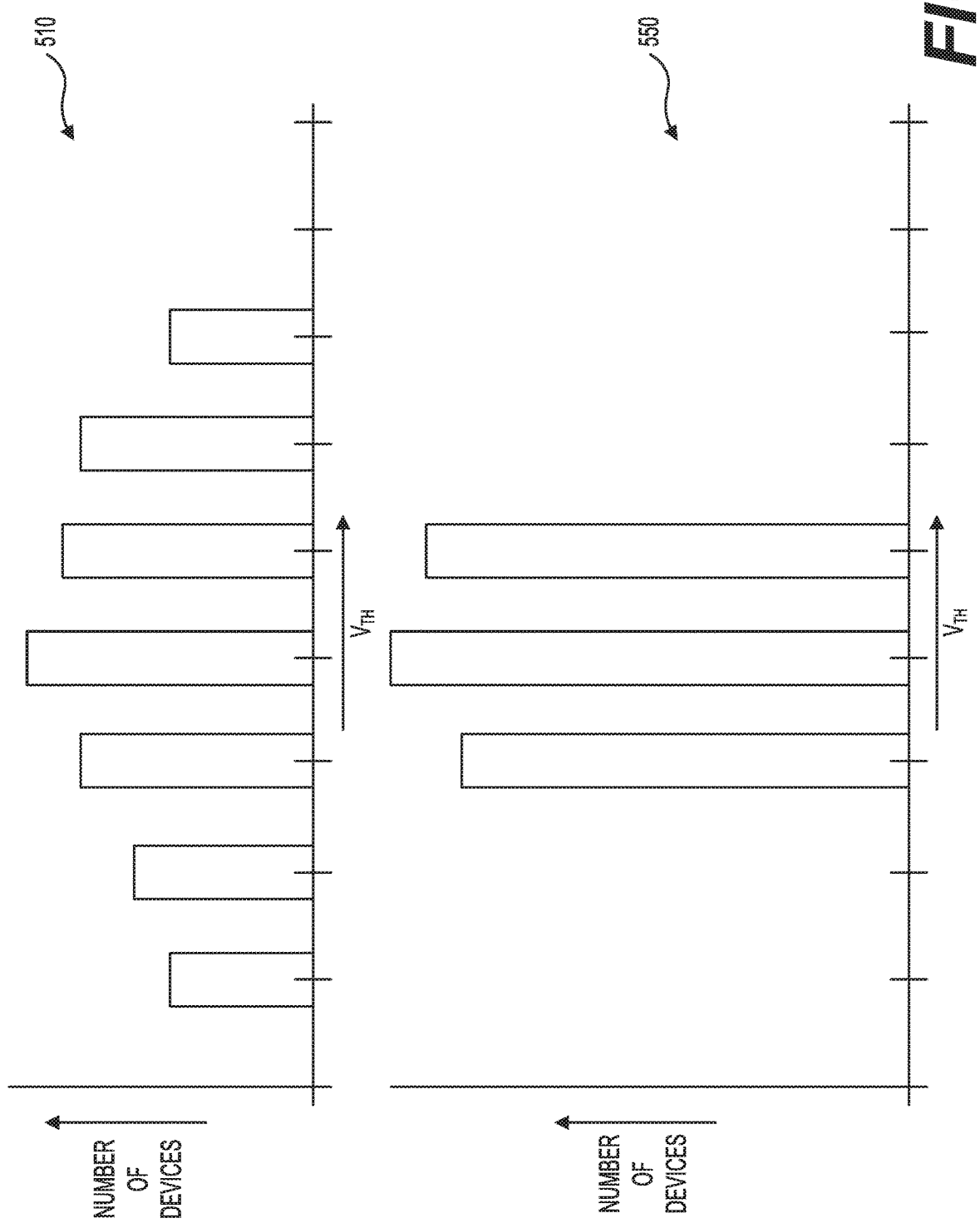
FIG. 5 shows histograms showing the distribution of threshold voltage before and after offset compensation.

FIG. 5 shows histograms 510 and 550 showing the distribution of threshold voltages of the devices (e.g., any of the device 100, device 200, or device 300) before and after offset compensation. In this example, the vertical axis for each of histograms 510 and 550 shows the number of devices that are targeted for threshold voltage offset compensation. In one example, the number of devices may correspond to all of the transistors on a single integrated circuit. Alternatively, the number of devices may correspond to a portion of an integrated circuit. By actively adjusting the threshold voltage of the transistors almost all of the transistors in a circuit are made to have nearly identical threshold voltage. If the distribution of the threshold voltages can be narrowed, then the supply voltage can be reduced, lowering the dynamic power consumption quadratically. In one example, a first distribution of a threshold voltage associated with the devices may have a first value indicative of a measure of spread of the threshold voltage. Control logic 450 of FIG. 4 may be used to modify a threshold voltage associated with each of the devices such that the first distribution is changed to a second distribution having a second value of the measure of spread of the threshold voltage representing a lower variation among threshold voltages of the devices. The measure of spread may be selected from among one of variance, standard deviation, or range.

Figure 6:
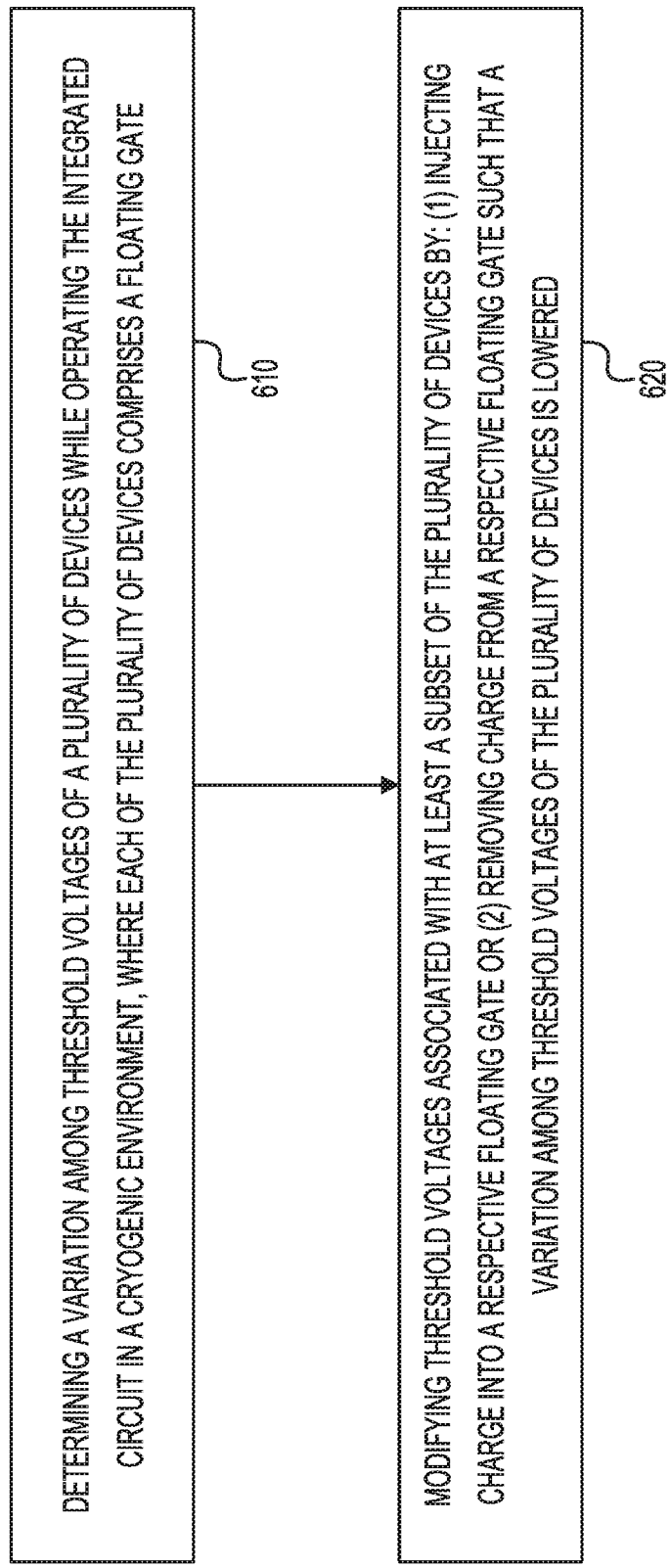
FIG. 6 shows a flow chart of a method in accordance with one example.

FIG. 6 shows a flow chart 600 of a method in accordance with one example, Step 610 may include determining a variation among threshold voltages of the plurality of devices while operating the integrated circuit in a cryogenic environment, where each of the plurality of devices comprises a floating gate. An initial part of this process may involve measuring the transistor threshold voltage for each of the devices. Control logic 450 may be used to measure the threshold voltages. These measurements may be performed to determine a measure of spread of a distribution of a threshold voltage associated with the plurality of devices. The measure of spread may be selected from among one of variance, standard deviation, or range. In one example, instead of measuring the threshold voltage of each device, proxies for the variation in the threshold voltages may be used. As an example, control logic 450 may be configured such that an error rate associated with signals processed by the devices may be measured. By performing the error rate analysis over a number of circuits, a correlation between the variation in the threshold voltages and the error rate may be established. In this manner, the error rate may be used as a proxy as part of the step of determining the variation among the threshold voltages.

Step 620 may include modifying threshold voltages associated with at least a subset of the plurality of devices by: (1) injecting charge into a respective floating gate or (2) removing charge from a respective floating gate such that a variation among threshold voltages of the plurality of devices is lowered. Depending on the device type (e.g., device 100, device 200, or device 300) the corresponding processes described earlier may be used. Control logic 450 may be used to add or remove charge from the floating gate capacitance to adjust the threshold voltage to some predefined value. In this example, every transistor in the circuit undergoes this calibration, but the process is only required to run after the initial cooldown of the chip to cryogenic temperatures. As explained earlier, advantageously, the lower variation among the threshold voltages of the transistors may allow lowering of the supply voltage. This in turn may lower the dynamic power consumption by a circuit quadratically.

In certain examples devices described herein may be included in a low power cryogenic-CMOS interface for controlling qubit gates. Controlling a quantum device requires generating a very large number of static and dynamic voltage signals, ideally at cryogenic temperatures in close integration with the quantum device. As used in this disclosure, the term "cryogenic temperature(s)" means any temperature equal to or less than 300 Kelvin. This is a major challenge given that the cryo-environment strongly constrains power dissipation of any active electronics. In addition, the large number of voltage signals also need to be coupled to the qubit gates in the quantum computing device. This is because potentially many thousands of wires need to be connected to the voltage sources for driving the qubit gates in the quantum computing device. Moreover, conventionally qubits have been controlled with room temperature pulse generators that must generate large signals that are attenuated in the cryostat. The power required to overcome this attenuation, and furthermore the power needed to drive the cable impedance, is an impediment to scaling quantum computers.

Certain examples described in this disclosure relate to cryogenic control circuits and architecture for a quantum computing device. The control architecture includes an integrated circuit control chip, containing cryogenic control circuits, that is tightly integrated with the qubit plane. As an example, the control chip can be wire-bonded, or flip-chip mounted to the qubit plane. In addition, the control chip stores a charge on a capacitor (that includes the interconnect capacitance) to generate a voltage bias. A single digital to analog converter may be used to set the charge on each capacitor, which at cryo-temperatures remains for a long time on account of the extremely low leakage pathways at these temperatures. Refresh of the charge can be made cyclically on timescale commensurate with qubit operation. The challenge associated with heat generated from attenuation is addressed by deploying a "charge-shuffle" circuit—moving charge between capacitors to generate a voltage pulse. The capacitance is reduced as much as possible via the tight integration between the cryogenic-CMOS control chip and the qubit plane. This tight integration, for example via chip-stack packaging approaches, can reduce the capacitance dramatically, thereby impacting the dissipated power.

Figure 7:
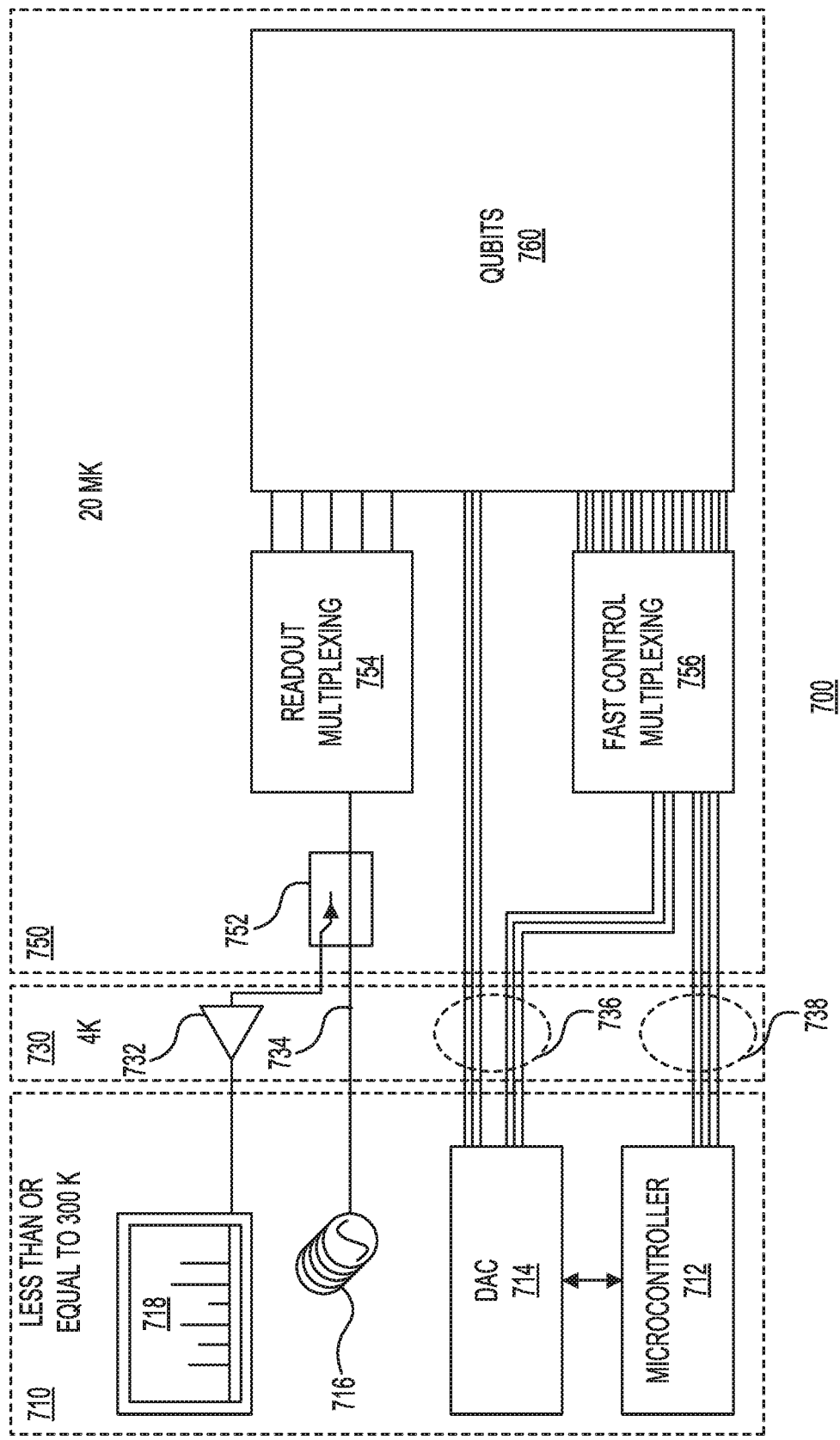
FIG. 7 shows a system for controlling qubits in accordance with one example.

The qubit plane may include topological computing gates that may operate at approximately 20 milli-Kelvin (~20 mK). The quantum computing devices may process quantum information, e.g., qubits. A qubit may be implemented using various physical systems, including photons, electrons, Josephson junctions, quantum dots, or heterostructures. The quantum state(s) may be encoded as a direction of spin, another aspect of spin, charge, energy, or excitation stages as part of a qubit, or a topological phase of superconducting matter. The example qubits may operate based on either low-frequency DC signals (e.g., bias currents) or high-frequency radio frequency signals (e.g., 10 GHz signals) or based on a combination of both. In certain examples, microwave signals may be used to control the superconducting devices, including, for example the state of the quantum bits (qubits). Certain implementations of the gates for quantum bits (qubits) may require high-frequency microwave signals, FIG. 7 shows a system 700 for controlling qubits in accordance with one example. In this example, system 700 may include multiple stages, each of which may be configured to operate at a different temperature. Thus, system 700 may include stages 710, 730, and 750. Stage 710 may include components configured to operate at cryogenic temperature (e.g., less than or equal to 300 Kelvin), Stage 730 may include components configured to operate at or below 300 Kelvin and up to 4 Kelvin. Stage 750 may include components configured to operate at or around 20 milli-Kelvin (mK). Stage 710 may include a microcontroller 712 (or a microprocessor), a digital-to-analog converter (DAC) 714, signal generators 716, and measurement devices 718, Microcontroller 712 may generate control signals configured to control qubits and other aspects of system 700. DAC 714 may receive digital control signals from microcontroller 712 (or from other components) and convert those into an analog form. The analog signals may then be transmitted to the other stages, as needed. Signal generators 716 may include microwave signal generators and other clock signal generators, as needed. Measurement devices 718 may include instrumentation, such as spectrum analyzers. In one example, each of microcontroller 712 (or a microprocessor), a digital-to-analog converter (DAC) 714, signal generators 716, and measurement devices 718 may include devices described earlier allowing for lowering power consumed by such components.

With continued reference to FIG. 7, stage 730 may include components configured to interconnect stage 710 with stage 750 in a manner that reduces thermal load and allows efficient connectivity between the components at room temperature and the components at 20 milli-Kelvin (mK). Thus, in this example, stage 730 may include component 732, interconnect 734, interconnect 736, and interconnect 738. In one example, component 732 may be implemented as high-electron-mobility transistor(s) (HEMT(s)) low noise amplifiers. Interconnects 734, 736, and 738 may be implemented as cables comprising conductors, such as niobium and copper. The conductors may be insulated within the interconnects using appropriate dielectric materials, such as polyimide.

Still referring to FIG. 7, stage 750 may include a coupler 752, readout multiplexing 754, fast control multiplexing 756, and qubits 760. Coupler 752 may couple signals from the signal generators (e.g., signal generators 716) to readout multiplexing 754. Coupler 752 may also direct any reflected signals to component 732. Readout multiplexing 754 and fast control multiplexing 756 may be implemented on a single control chip (sometimes referred to as the cryogenic-control CMOS chip). In one example, readout multiplexing 754 may be implemented using superconducting materials, such as niobium on an inert substrate, such as sapphire. Readout multiplexing 754 chip may contain multiple inductive, capacitive, and resistive elements of suitable sizes to form bank(s) of resonators. At cryogenic temperatures, resonator circuits exhibit superconductivity and produce a resonator with high quality factors. This may provide an efficient low loss frequency multiplexing mechanism. In one example, the cryogenic-CMOS control chip (e.g., an ASIC manufactured using a semiconductor technology, such as CMOS) may be mounted on the same substrate as the qubits (e.g., qubits 760) and may be configured to operate at the same cryogenic temperature as the qubits (e.g., 20 mK).

Figure 8:
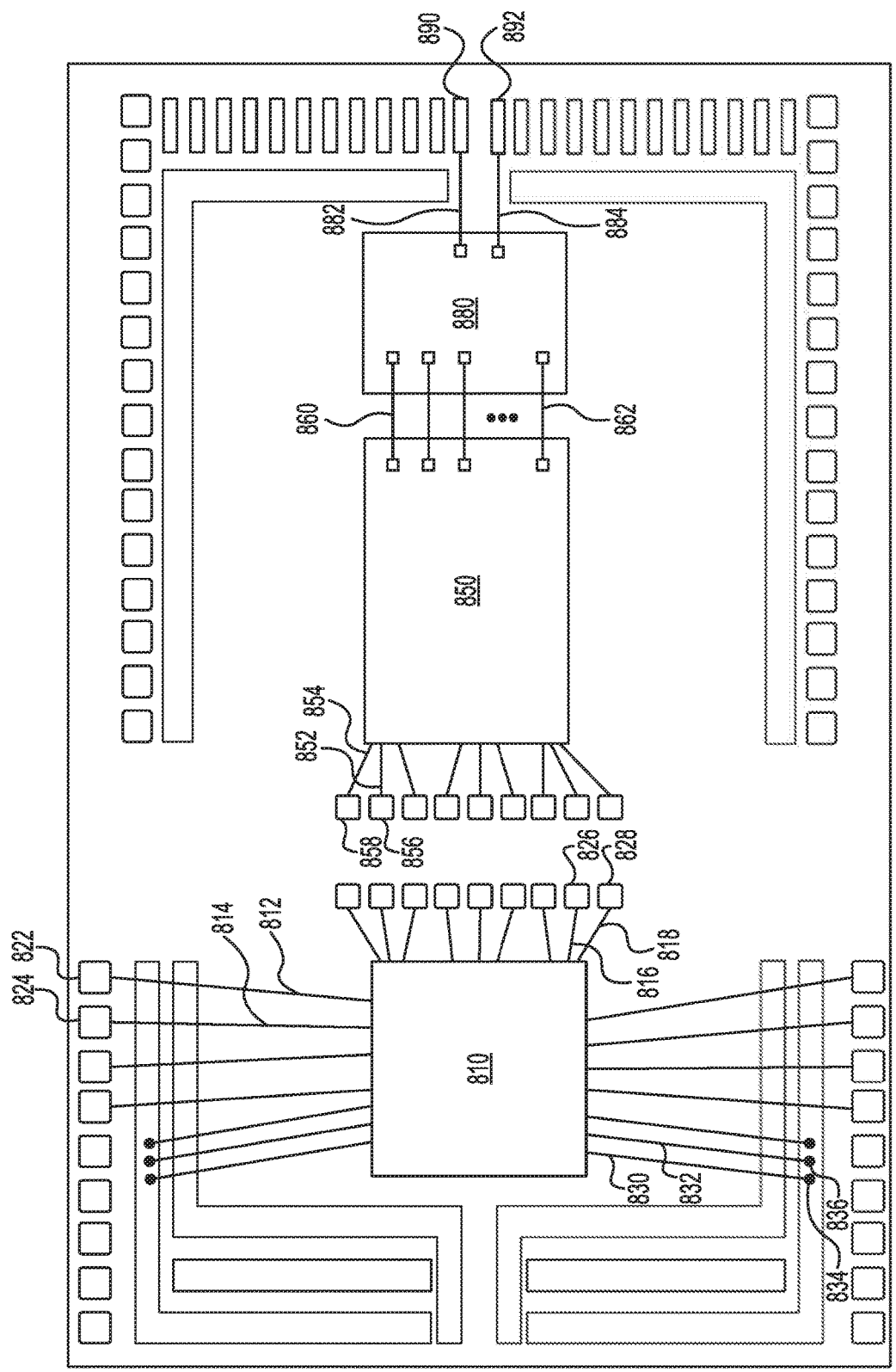
FIG. 8 shows a common substrate including a cryogenic-CMOS control chip, a qubit chip; and a resonator chip in accordance with one example.

FIG. 8 shows a common substrate 800 including a cryogenic-CMOS control chip 810, a qubit chip 850, and a resonator chip 880 in accordance with one example. Cryogenic-CMOS control chip 810 may be coupled to contact pads (e.g., contact pads 822 and 824) via wire bonds (e.g., wire bonds 812 and 814). Cryogenic-CMOS control chip 810 may further be coupled to contact pads (e.g., contact pads 826 and 828) via wire bonds (e.g., wire bonds 816 and 818). Cryogenic-CMOS control chip 810 may further be coupled to other contacts (e.g., contacts 834 and 836) via wire bonds (e.g., wire bonds 830 and 832). Qubit chip 850 may be coupled to contact pads (e.g., contact pads 856 and 858) via wire bonds (e.g., wire bonds 852 and 854). Qubit chip 850 may be coupled to resonator chip 880 via wire bonds (e.g., wire bonds 860 and 862). Resonator chip 880 may be coupled to contacts (e.g., contacts 890 and 892) via wire bonds (e.g., wire bonds 882 and 884). Although this example shows the tight integration between the control chip and the qubits via wire bonding, other techniques may also be used. As an example, the control chip may be flip-chip bonded to the substrate with the qubits. Alternatively, package-on-package, system-in-package, or other multi-chip assemblies may also be used.

Although the above description refers to quantum devices, the systems described herein can be implemented to support any service or application that can be offered via a combination of computing, networking, and storage resources, such as via a data center or other infrastructure for delivering a service or an application. The described aspects can also be implemented in cloud computing environments. Cloud computing may refer to a model for enabling on-demand network access to a shared pool of configurable computing resources. For example, cloud computing can be employed in the marketplace to offer ubiquitous and convenient on-demand access to the shared pool of configurable computing resources, A cloud computing model can be composed of various characteristics such as, for example, on-demand self-service, broad network access, resource pooling, rapid elasticity, measured service, and so forth. A cloud computing model may be used to expose various service models, such as, for example, Hardware as a Service ("HaaS"), Software as a Service ("SaaS"), Platform as a Service ("PaaS"), and Infrastructure as a Service ("IaaS"), A cloud computing model can also be deployed using different deployment models such as private cloud, community cloud, public cloud, hybrid cloud, and so forth.

In conclusion, in one aspect, the present disclosure relates to a system including a plurality of devices configured to operate in a cryogenic environment, where a first distribution of a threshold voltage associated with the plurality of devices having a first value indicative of a measure of spread of the threshold voltage. The system may further include control logic, coupled to each of the plurality of devices, configured to modify a threshold voltage associated with each of the plurality of devices such that the first distribution is changed to a second distribution having a second value of the measure of spread of the threshold voltage representing a lower variation among threshold voltages of the plurality of devices.

The measure of spread may be selected from among one of variance, standard deviation, or range. Each of the plurality of devices may comprise a floating gate. The system may include comprises a charge pump, where each of the plurality of devices comprises a terminal for receiving a trim voltage via the charge pump, and where the control logic is further configured to modify a threshold voltage associated with each of the plurality devices by either injecting charge into the floating gate or removing charge from the floating gate.

The system may include a charge pump, and where each of the plurality of devices comprises a gate terminal for receiving a voltage via the charge pump, and where the control logic is further configured to modify a threshold voltage associated with each of the plurality devices by either injecting charge into the floating gate or removing charge from the floating gate.

The system may include a charge pump, and where each of the plurality of devices comprises a terminal coupled to a split-gate, for receiving a trim voltage via the charge pump, and where the control logic is further configured to modify a threshold voltage associated with each of the plurality devices by either injecting charge into the floating gate or removing charge from the floating gate. The control logic may further be configured to determine a threshold voltage associated with each of the plurality of devices.

In another aspect, the present disclosure relates to a method in a system comprising a plurality of devices having an associated threshold voltage. The system may include determining a variation among threshold voltages of the plurality of devices while operating the integrated circuit in a cryogenic environment, where each of the plurality of devices comprises a floating gate. The method may further include modifying threshold voltages associated with at least a subset of the plurality of devices by: (1) injecting charge into a respective floating gate or (2) removing charge from a respective floating gate such that a variation among threshold voltages of the plurality of devices is lowered.

The determining the variation may comprise determining a measure of spread is selected from among one of variance, standard deviation, or range. The determining the variation among the threshold voltages may comprise determining an error rate associated with an operation associated with the integrated circuit. The determining the variation among the threshold voltages may comprise determining a threshold voltage associated with each of the plurality of devices.

The modifying the threshold voltage associated with each of the plurality devices may comprise applying a voltage via a terminal for receiving the trim voltage. The modifying the threshold voltage associated with each of the plurality devices may comprise applying a voltage via a gate terminal.

In yet another aspect, the present disclosure relates to a system including a first integrated circuit comprising a quantum device including a plurality of qubit gates, where the quantum device is configured to operate at a cryogenic temperature. The system may further include a second integrated circuit configured to operate at the cryogenic temperature, where the first integrated circuit is coupled to the second integrated circuit. The second integrated circuit may include a plurality of devices, where a first distribution of a threshold voltage associated with the plurality of devices having a first value indicative of a measure of spread of the threshold voltage. The second integrated circuit may further include control logic, coupled to each of the plurality of devices, configured to modify a threshold voltage associated with each of the plurality of devices such that the first distribution is changed to a second distribution having a second value of the measure of spread of the threshold voltage representing a lower variation among threshold voltages of the plurality of devices.

The measure of spread may be selected from among one of variance, standard deviation, or range. Each of the plurality of devices may comprise a floating gate. The system may include comprises a charge pump, where each of the plurality of devices comprises a terminal for receiving a trim voltage via the charge pump, and where the control logic is further configured to modify a threshold voltage associated with each of the plurality devices by either injecting charge into the floating gate or removing charge from the floating gate.

The system may include a charge pump, and where each of the plurality of devices comprises a gate terminal for receiving a voltage via the charge pump, and where the control logic is further configured to modify a threshold voltage associated with each of the plurality devices by either injecting charge into the floating gate or removing charge from the floating gate.

The system may include a charge pump, and where each of the plurality of devices comprises a terminal coupled to a split-gate, for receiving a trim voltage via the charge pump, and where the control logic is further configured to modify a threshold voltage associated with each of the plurality devices by either injecting charge into the floating gate or removing charge from the floating gate. The control logic may further be configured to determine a threshold voltage associated with each of the plurality of devices.

It is to be understood that the methods, modules, and components depicted herein are merely exemplary. For example, and without limitation, illustrative types of superconducting devices may include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc.

In addition, in an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

Furthermore, those skilled in the art will recognize that boundaries between the functionality of the above-described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or an, as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A system for interfacing with qubit gates comprising:
a plurality of devices configured to operate in a cryogenic environment, wherein a first distribution of a threshold voltage associated with the plurality of devices having a first value indicative of a measure of spread of the threshold voltage; and
control logic, coupled to each of the plurality of devices, configured to modify a threshold voltage associated with each of the plurality of devices such that the first distribution is changed to a second distribution having a second value of the measure of spread of the threshold voltage representing a lower variation among threshold voltages of the plurality of devices.

2. The system of claim 1, wherein the measure of spread is selected from among one of variance, standard deviation, or range.

3. The system of claim 1, wherein each of the plurality of devices comprises a floating gate.

4. The system of claim 3, wherein the system comprises a charge pump, wherein each of the plurality of devices comprises a terminal for receiving a trim voltage via the charge pump, and wherein the control logic is further configured to modify a threshold voltage associated with each of the plurality devices by either injecting charge into the floating gate or removing charge from the floating gate.

5. The system of claim 3, wherein the system comprises a charge pump, and wherein each of the plurality of devices comprises a gate terminal for receiving a voltage via the charge pump, and wherein the control logic is further configured to modify a threshold voltage associated with each of the plurality devices by either injecting charge into the floating gate or removing charge from the floating gate.

6. The system of claim 3, wherein the system comprises a charge pump, and wherein each of the plurality of devices comprises a terminal coupled to a split-gate, for receiving a trim voltage via the charge pump, and wherein the control logic is further configured to modify a threshold voltage associated with each of the plurality devices by either injecting charge into the floating gate or removing charge from the floating gate.

7. The system of claim 3, wherein the control logic is further configured to determine a threshold voltage associated with each of the plurality of devices.

8. A method in a system comprising a plurality of devices having an associated threshold voltage, the method comprising:
determining a variation among threshold voltages of the plurality of devices while operating the integrated circuit in a cryogenic environment, wherein each of the plurality of devices comprises a floating gate; and
modifying threshold voltages associated with at least a subset of the plurality of devices by: (1) injecting charge into a respective floating gate or (2) removing charge from a respective floating gate such that a variation among threshold voltages of the plurality of devices is lowered.

9. The method of claim 8, wherein the determining the variation comprises determining a measure of spread is selected from among one of variance, standard deviation, or range.

10. The method of claim 8, wherein the determining the variation among the threshold voltages comprises determining an error rate associated with an operation associated with the integrated circuit.

11. The method of claim 8, wherein the determining the variation among the threshold voltages comprises determining a threshold voltage associated with each of the plurality of devices.

12. The method of claim 8, wherein the modifying the threshold voltage associated with each of the plurality devices comprises applying a voltage via a terminal for receiving the trim voltage.

13. The method of claim 8, wherein the modifying the threshold voltage associated with each of the plurality devices comprises applying a voltage via a gate terminal.

14. A system comprising:
a first integrated circuit comprising a quantum device including a plurality of qubit gates, wherein the quantum device is configured to operate at a cryogenic temperature; and
a second integrated circuit configured to operate at the cryogenic temperature, wherein the first integrated circuit is coupled to the second integrated circuit, and wherein the second integrated circuit comprises:
a plurality of devices, wherein a first distribution of a threshold voltage associated with the plurality of devices having a first value indicative of a measure of spread of the threshold voltage, and
control logic, coupled to each of the plurality of devices, configured to modify a threshold voltage associated with each of the plurality of devices such that the first distribution is changed to a second distribution having a second value of the measure of spread of the threshold voltage representing a lower variation among threshold voltages of the plurality of devices.

15. The system of claim 14, wherein the measure of spread is selected from among one of variance, standard deviation, or range.

16. The system of claim 15, wherein each of the plurality of devices comprises a floating gate.

17. The system of claim 16, wherein the system comprises a charge pump, and wherein each of the plurality of devices comprises a terminal for receiving a trim voltage via the charge pump, and wherein the control logic is further configured to modify a threshold voltage associated with each of the plurality devices by either injecting charge into the floating gate or removing charge from the floating gate.

18. The system of claim 16, wherein the system comprises a charge pump, and wherein each of the plurality of devices comprises a gate terminal for receiving a voltage via the charge pump, and wherein the control logic is further configured to modify a threshold voltage associated with each of the plurality devices by either injecting charge into the floating gate or removing charge from the floating gate.

19. The system of claim 16, wherein the system comprises a charge pump, and wherein each of the plurality of devices comprises a terminal coupled to a split-gate, for receiving a trim voltage via the charge pump, and wherein the control logic is further configured to modify a threshold voltage associated with each of the plurality devices by either injecting charge into the floating gate or removing charge from the floating gate.

20. The system of claim 16, wherein the control logic is further configured to determine a threshold voltage associated with each of the plurality of devices.

* * * * *